United States Patent [19]

Lewicki et al.

[11] Patent Number: 5,528,185

[45] Date of Patent: Jun. 18, 1996

[54] CMOS STROBED COMPARATOR WITH PROGRAMMABLE HYSTERESIS

[75] Inventors: Laurence D. Lewicki, Sunnyvale; Ion E. Opris, Stanford, both of Calif.

[73] Assignee: National Semiconductor Corporation, Santa Clara, Calif.

[21] Appl. No.: 387,169

[22] Filed: Feb. 13, 1995

[51] Int. Cl.⁶ .......................... H03K 3/037; H03K 3/356
[52] U.S. Cl. ........................ 327/206; 327/203; 327/215; 327/225
[58] Field of Search ................................ 327/201, 202, 327/203, 205, 206, 208, 210, 215, 219, 225, 560, 561, 562, 563, 198; 340/146.2

[56] References Cited

U.S. PATENT DOCUMENTS

| | | | |
|---|---|---|---|
| 4,670,671 | 6/1987 | DeWeck | 307/355 |
| 4,717,838 | 1/1988 | Brehmer et al. | 307/362 |
| 4,777,388 | 10/1988 | Widener | 327/202 |
| 4,810,908 | 3/1989 | Suzuki et al. | 327/306 |
| 4,940,907 | 7/1990 | Laude | 307/355 |
| 4,963,772 | 10/1990 | Dike | 327/198 |
| 5,003,513 | 3/1991 | Porter et al. | 327/208 |
| 5,039,888 | 8/1991 | Bell et al. | 307/494 |
| 5,329,173 | 7/1994 | Murakami et al. | 327/205 |
| 5,367,211 | 11/1994 | Giordano et al. | 327/205 |
| 5,369,319 | 11/1994 | Good et al. | 327/206 |

OTHER PUBLICATIONS

Sackinger, Edward and Guggenbuhl, Walter, A Versatile Building Block: The CMOS Differential Difference Amplifier, IEEE Journal of Solid–State Circuits, vol. SC–22, No. 2, Apr. 1987.

Allen and Holberg, CMOS Analog Circuit Design, New York: Holt Rinehard and Wilson, pp. 349–356, 1987.

Primary Examiner—Timothy P. Callahan
Assistant Examiner—My-Trang Nu Ton
Attorney, Agent, or Firm—Limbach & Limbach

[57] ABSTRACT

A comparator produces a digital output based upon a differential input signal and hysteresis. To inject positive feedback, a second differential pair is added. This feedback pair is nominally identical to the input pair. If the comparator has recently sensed a positive input of sufficient magnitude to drive the comparator output high, switches are turned on coupling a positive hysteresis voltage to the inputs of the feedback differential pair. By coupling a fixed current differential from the second differential pair to the input differential pair, the effective switching threshold of the comparator is changed. A non-overlapping clock generator is formed so that the switches will not turn on simultaneously so as to short the hysteresis reference voltage source. The hysteresis voltage source can be centered at any voltage that does not exceed the common mode range of the input pair. In a first alternative embodiment, the ratio of feedback is not unity, such that the hysteresis voltage is linearly related to the noise margin. In a second alternative embodiment, a more complicated switch matrix can be used to provide a variety of different hysteresis voltage levels. By including a more complicated switch matrix having several taps, the level of hysteresis can be made programmable. In a third alternative embodiment, the comparator structure according to the present invention is translated so that the differential pairs are formed with p-channel transistors. In a fourth alternative embodiment, the programmable hysteresis is applied to a sense amplifier.

19 Claims, 6 Drawing Sheets

CMOS STROBED COMPARATOR WITH PROGRAMMABLE HYSTERESIS

BACKGROUND OF THE INVENTION

1. Field of the Invention

The present invention relates to differential comparators for producing digital outputs, and, specifically, to the implementation of process and temperature invariant hysteresis.

2. Discussion of the Related Art

In an automotive setting, to reduce the amount of wiring in the wiring harnesses, a differential bus arrangement similar to an ethernet is constructed to which several devices are connected. Since the devices share bandwidth on the bus, the differential bus must handle a high data rate. For a lengthy bus, the differential signal may be attenuated greatly in certain areas physically remote from the presently driving device. In order to receive digital information transmitted on the bus, a comparator is desired which can detect 50 mV$_{p-p}$ input levels with a controlled level of hysteresis that is more than 8 mV but less than 15 mV.

As illustrated in FIG. 1, the common mode input voltage to the comparator is anywhere between the supply voltages, typically +5 V and ground. Valid output data must be available in 100 ns to meet the bandwidth requirement of the differential bus configuration. To accommodate the temperature range for an automotive application, the temperature range for this application is −40 to +155 degrees Celsius. Furthermore, the design must be robust over varying process corners produced during fabrication of the integrated circuit.

Several different design approaches were considered and found not adequate for all process corners or over the extremely wide temperature range of this application.

One approach is to use a comparator constructed with a standard differential pair and loaded by cross-coupled current mirrors with greater than unity gain and connected in such a way as to exhibit regenerative positive feedback, thus creating hysteresis. See, P. E. Allen and D. R. Holberg, CMOS Analog Circuit Design, New York: Holt Rinehart and Wilson, pp. 349–356, 1987. The level of hysteresis exhibited by this design is a function of the ratio of the positive feedback, the input stage transconductance, and the speed of the comparator coming out of saturation to change state with respect to changes in the input signal. The last two effects are strong functions of temperature and process variations. Due to the fact that the internal nodes saturate during operation, this comparator changes state too slowly for the present high speed application. Furthermore, the level of hysteresis is not adjustable, but rather is fixed by the circuit design and implementation.

The speed problem exhibited by the above-described design is somewhat improved by the design of Lionel M. De Weck, High Speed Comparator Having Controlled Hysteresis, U.S. Pat. No. 4,607,671, Jun. 2, 1987. But the hysteresis in this design is still set by the transconductance of the comparator input stage and, therefore, is still heavily dependent on process corners and temperature.

The comparator disclosed by David P. Laude, Precision CMOS Comparator With Hysteresis, U.S. Pat. No. 4,940,907, Jul. 10, 1990, attempts to fix the hysteresis problem by a replica bias method. However, the gain of the amplifier is relatively low because there is essentially only one gain stage. In order to acquire signals in 100 nanoseconds, this type of comparator requires a very high supply current.

Prior art comparators suffer either from process dependence or temperature dependence on the hysteresis level, or speed and power inadequacies.

SUMMARY OF THE INVENTION

The present invention provides a comparator that produces a digital output based upon a differential input signal and hysteresis. It is desirable to add hysteresis to the comparator, so that once it has settled on an output, in order to switch states so as-to detect the logically opposite output state, the differential input must change by an amount greater than $2 * V_{hysteresis}$. To inject positive feedback, a second differential pair is added. This feedback pair is nominally identical to the input pair. If the comparator has recently sensed a positive input of sufficient magnitude to drive the comparator output high, switches are turned on coupling a positive hysteresis voltage to the inputs of the feedback differential pair. By coupling a fixed current differential from the second differential pair to the input differential pair, the effective switching threshold of the comparator is changed. A non-overlapping clock generator is formed so that the switches will not turn on simultaneously so as to short the $V_{hysteresis}$ reference voltage source. The $V_{hysteresis}$ voltage source can be centered at any voltage that does not exceed the common mode range of the input pair.

According to a first alternative embodiment, the ratio of feedback is not unity, such that the hysteresis voltage is linearly related to the noise margin, but is not equal to the noise margin. This would have the effect that the $V_{hysteresis}$ voltage would be multiplied by some factor in the inequalities which define the comparator's switching behavior. According to a second alternative embodiment, a more complicated switch matrix which can be used to provide a variety of different hysteresis voltage levels. By including a more complicated switch matrix having several taps, the level of hysteresis can be made programmable. In a third alternative embodiment, the comparator structure according to the present invention is easily translated so that the differential pairs are formed with p-channel transistors, and the current mirroring is done with n-channel transistors. According to a fourth alternative embodiment of the present invention, the programmable hysteresis can be applied to a sense amplifier.

The second alternative embodiment of the present invention is very useful in adaptive threshold systems. It is desirable that the noise margin be approximately 50% input range. Using the programmability of the hysteresis level according to the present invention, it is possible to optimally set the hysteresis voltage level using adaptive feedback techniques.

This invention virtually eliminates the effects of input stage transconductance on hysteresis. This eliminates the effects of processing and temperature on hysteresis and thresholds.

DETAILED DESCRIPTION OF THE INVENTION

The present invention combines the differential difference amplifier structure described by E. Sackinger and W. Guggenbuhl, "A Versatile Building Block: The CMOS Differential Difference Amplifier", IEEE J. Solid State Circuits, vol. SC-22 no. 2, pp. 287–294, April 1987, with the high speed strobed comparator technique described by Kevin E. Brehmer et al., High Input Impedance, High Gain CMOS Strobed Comparator, U.S. Pat. No. 4,717,838, Jan. 5, 1988. This invention virtually eliminates the effects of input stage transconductance on hysteresis. This eliminates the effects of processing and temperature on hysteresis and thresholds. The preferred embodiment of the present invention is illustrated in FIG. 2.

Consider first the nominal strobed comparator portion of the circuit (in which of transistors M3 and M4 carry no current). Neglecting, for the moment, the effect of transistors M3 and M4, transistors M1 and M2 form an input differential pair biased by current sourced from the drain of transistor M14. Transistors M1, M2 and M14, as configured in FIG. 2, form an input stage. The current sourced from the drain of transistor M14 is determined by the current mirror formed by transistors M13 and M14. A current mirror is a circuit in which the current flowing in one part of the circuit is replicated at least once in another part of the circuit. This is accomplished by forcing the second part of the circuit to operate under conditions which are as similar as possible to those in the first part of the circuit. Thus, the current from the current source I travels through the drain of transistor M13 and is reflected in transistor M14. The drain current from transistor M1 is reflected through the current mirror formed by transistors M5 and M6, such that the current through transistor M1 is essentially equal to the current through transistor M6. Likewise, the current from the drain of transistor M2 is reflected through the current mirror formed by transistors M7 and M8, such that the current through transistor M2 is essentially equal to the current through transistor M8.

Figure 1:
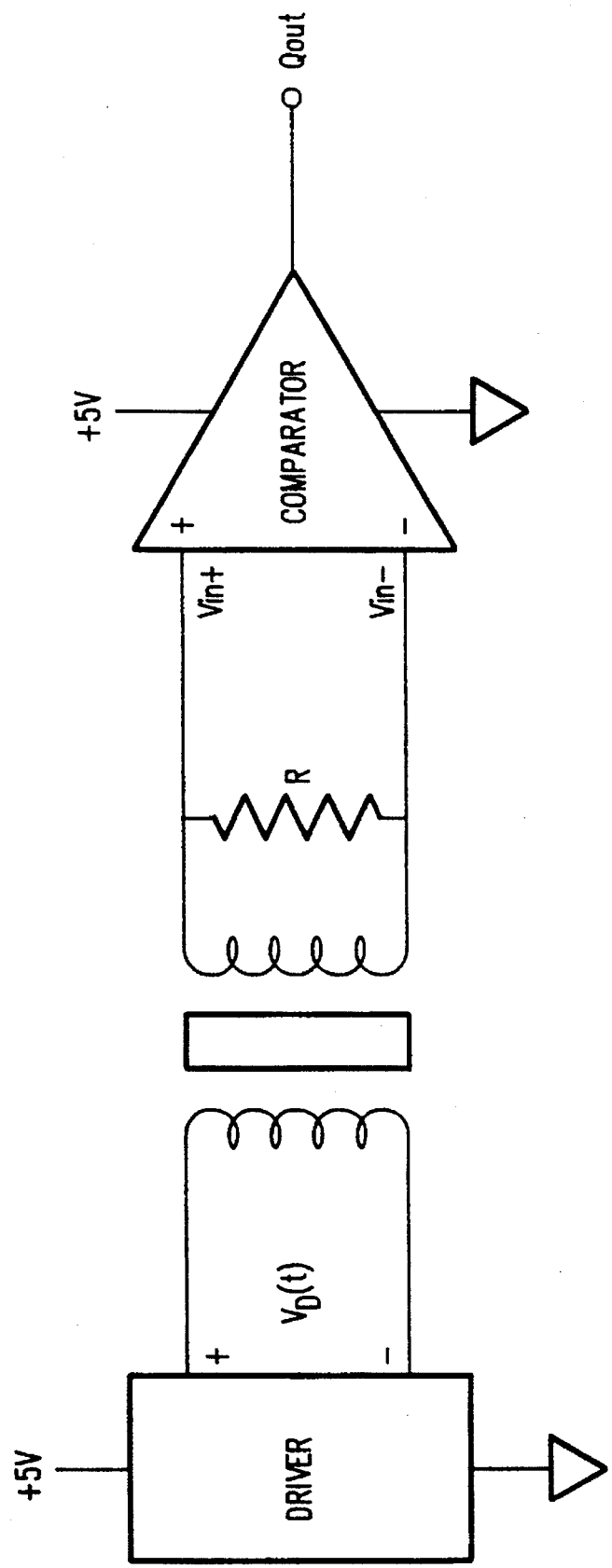
FIG. 1 illustrates a digital comparator and a model for the differential transmission medium and its driver.
Figure 2:
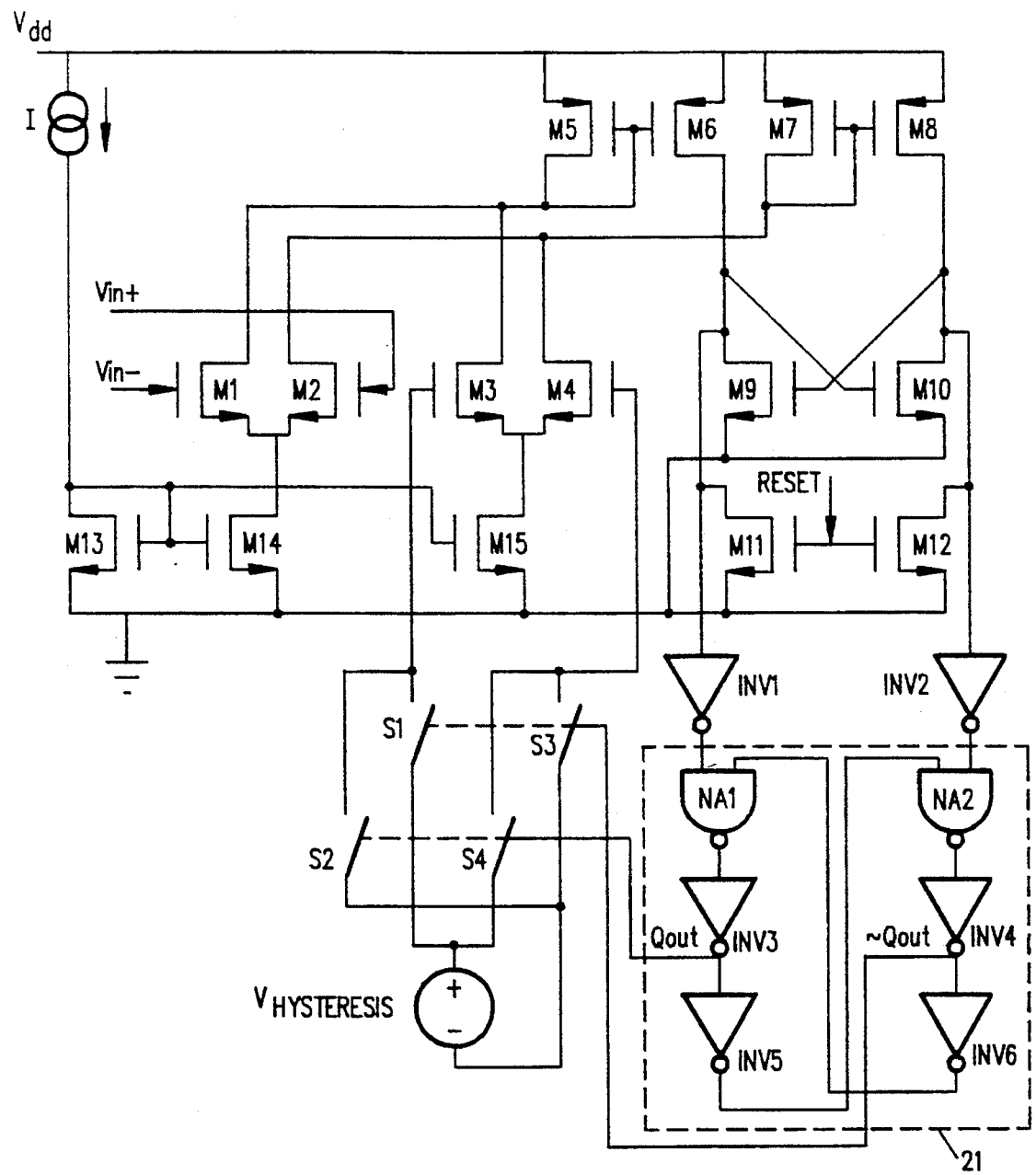
FIG. 2 shows a CMOS circuit which is the preferred embodiment of the present invention.

The strobed comparator shown in FIG. 2 has a reset phase during which the drains of both transistors M9 and M10 are pulled low by switch transistors M11 and M12, respectively. This forces the outputs of inverters INV1 and INV2 high and leaves the crosscoupled set-reset latch 21 formed by NA1, NA2, INV3, INV4, 1NV5, and INV6 unchanged from its previous state. When the reset signal is brought low transistors M11 and M12 are turned off allowing the drains of transistors M9 and M10 to rise in response to the drain currents from transistors M6 and M8, respectively. Assuming that there is an imbalance in the input voltages, for instance $V_{in+}$ is greater than $V_{in-}$, then the drain current from transistor M8 will be greater than the drain current from transistor M6. This current imbalance causes the drain of transistor M10 to rise faster than the drain of transistor M9. Since the drain of transistor M10 is connected to the gate of transistor M9, the n-channel transistor M9 is turned on, thereby pulling the drain of transistor M9 low. Since the gate of transistor M10 is pulled low, the n-channel transistor M10 is turned off. Transistors M6, M8, M9, and M10, ratioed inverters INV1 and INV2, and set-reset latch 21, as configured in FIG. 2, form a detection stage.

Furthermore, inverters INV1 and INV2 are ratioed such that the switching thresholds for the inverters are lower than the normal switching threshold, which is half the supply voltage. This lowered switching threshold causes the $Q_{out}$ and $\sim Q_{out}$ outputs to be produced quickly. Since the drains of transistors M9 and M10 had been precharged low by the Reset signal, these drains have only to reach the reduced inverter thresholds of transistor M9 and M10 to cause the S-R latch 21 to acquire the proper comparator output value $Q_{out}$. This ratioing is accomplished by making the n-channel pulldown transistors of inverters INV1 and INV2 wider than normal, such that the ratio of the pullup width to the pulldown width is less than the ratio of the n-type electron mobility to the p-type hole mobility. Eventually, when transistor M10 is turning off and transistor M9 is turning on, the drain of transistor M10 latches to the supply voltage $V_{dd}$, while the drain of transistor M9 latches to ground.

If the comparator is in the process of a comparison which will ultimately produce a $Q_{out}$ of one, by properly ratioing inverters INV1 and INV2, the drain of transistor M10 will rise to the lowered switching threshold of inverters INV2, causing the output of inverter INV2 to fall to a low logic level. When the output of inverter INV2 falls to a low logic level, the output of nand gate NA2 goes high, thereby setting the set-reset latch 21. Inverters INV3, INV4, 1NV5, and INV6 exist to provide the correct polarity of non-overlapping signals, to provide buffering to drive the capacitive loads of the switches S1, S2, S3, and S4, and to provide a sufficiently lengthy non-overlap period. $Q_{out}$ and $\sim Q_{out}$ are the comparator's complementary digital output.

It is desirable to add hysteresis to the comparator, so that once it has settled on an output $Q_{out}$, in order to switch states so as to detect the logically opposite output state, the differential input must change by an mount greater than 2 * $V_{hysteresis}$. When the last value of $Q_{out}$ had been 0, the equation representing the detection of logic one is as follows.

$$V_{in+} - V_{in-} > + V_{hysteresis}$$

However, after the above equation is satisfied, and an asserted $Q_{out}$ output has been output by the setting of S-R output latch 21, the equation representing the detection of a logic zero changes to the following.

$$V_{in+} - V_{in-} < - V_{hysteresis}$$

This hysteresis effect makes the comparator a device with memory, so that its present behavior is based upon the present inputs and state variables.

To inject positive feedback, a second differential pair, transistors M3 and M4, biased by current from the drain of transistor M15, is added. Transistors M3, M4, and M15, as configured in FIG. 2, form a feedback stage. Transistor M15 forms a current mirror with transistor M13, so that the current through transistor M15 is essentially identical to the current through transistor M13. This feedback pair transistors M3 and M4 is nominally identical to the input pair transistors M1 and M2 and the current sourced from the drain of transistor M15 is nominally identical to the current sourced by transistor M14. If the comparator has recently sensed a positive input of sufficient magnitude to drive $Q_{out}$ high (and the inverted output $\sim Q_{out}$ low), then switches S1 and S3 are turned on coupling a positive hysteresis voltage to the gates of transistors M4 and M3. This acts as positive feedback because transistor M4 will have a higher drain current than transistor M3—these current will sum in phase with the drain currents of transistors M2 and M1, respectively. The magnitude of the current differential between transistors M8 and M6 is increased by this positive feedback.

Figure 3:
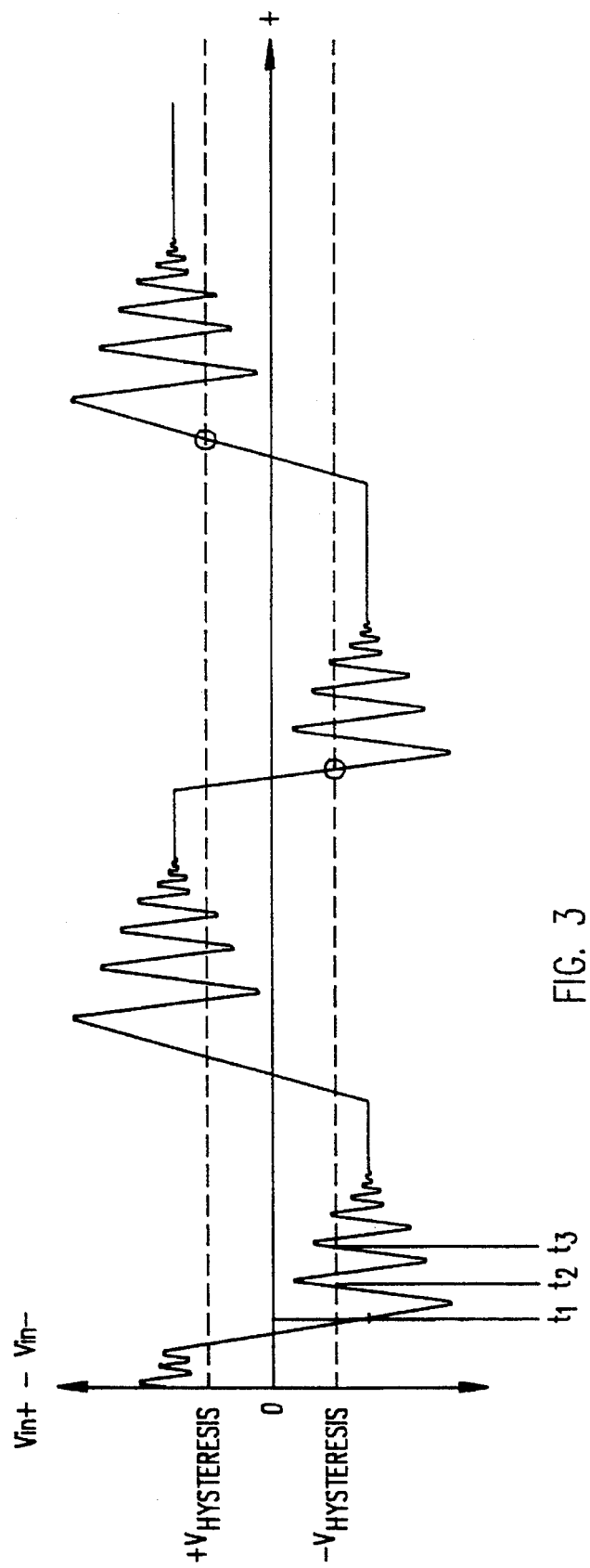
FIG. 3 illustrates the noise immunity of the comparator according to the present invention.

By coupling a fixed current differential from the second differential pair transistors M3 and M4 to the input differential pair transistors M1 and M2, the effective switching threshold of the comparator is changed as illustrated in FIG. 3. At time t=0 in FIG. 3, the comparator had previously output a one as $Q_{out}$. At time t=t1, the Reset signal is deasserted. Since $V_{in+}-V_{in-}$ is less than $-V_{hysteresis}$, the comparator outputs an asserted $Q_{out}$ output at time t=t1+tc (not shown), where tc is propagation delay time of the comparator. Although ringing and noise occur after t1, and although that ringing is sufficient as illustrated in FIG. 3 to cross the initial switching threshold of $-V_{hysteresis}$ at times t=t2 and t3, the outputting of a one at time t=t1+tc causes the switching threshold to change to $+V_{hysteresis}$ at that time t=t1+tc, so that the noise shown in FIG. 3 does no harm. The noise does not cause the comparator output $Q_{out}$ to glitch or incorrectly change states.

If the past $Q_{out}$ had been a one, when a negative going differential input $V_{in+}-V_{in-}$ is injected to the input pair transistors M2 and M1, it will have to be more negative than $-V_{hysteresis}$ in order for the comparator to change states. (In order for the sum of the drain currents from transistors M1 and M3 to be greater than the sum of the drain currents of transistors M2 and M4, $V_{in+}-V_{in-}$ must be more negative than $-V_{hysteresis}$.) When this happens and the output of the comparator changes states, switches S1 and S3 will be turned off and switches S2 and S4 will be turned on providing positive feedback once again.

NA1, NA2, INV3, INV4, INV5, and INV6 form a non-overlapping clock generator so that switches S1 and S2 (as well as switches S3 and S4) will not turn on simultaneously so as to short the $V_{hysteresis}$ reference voltage source. These switches S1, S2, S3 and S4 are normally made with single n-channel transistors; however, they could be constructed of transmission gates just as easily, since both $Q_{out}$ and $\sim Q_{out}$ are available to turn on the p-channel devices of the transmission gates without adding additional inverters. The $V_{hysteresis}$ voltage source can be centered at any voltage that does not exceed the common mode range of the input pair transistors M3 and M4.

There are several alternative embodiments to the present invention. For example, according to a first alternative embodiment, instead of designing the drain current through transistors M13, M14, and M15 to be equal, the current through transistor M15 could be less or greater than that in transistor M13. This could be accomplished by using a different transistor width for transistor M15 than for transistors M13 and M14. Alternatively if transistors M13, M14, and M15 are all the same size, a separate current mirror could drive transistor M15. This would have the effect that the $V_{hysteresis}$ voltage would be multiplied by some factor representative of the current ratio between transistors M15 and M14 in the inequalities shown above which define the comparator's switching behavior. By the same token, the currents through transistors M6 and M8 can be made unequal, yet proportional, to the currents through transistors M5 and M7, respectively, by using a non-unity transistor width ratio between transistors M5 and M6 and between transistors M7 and M8.

Figure 4:
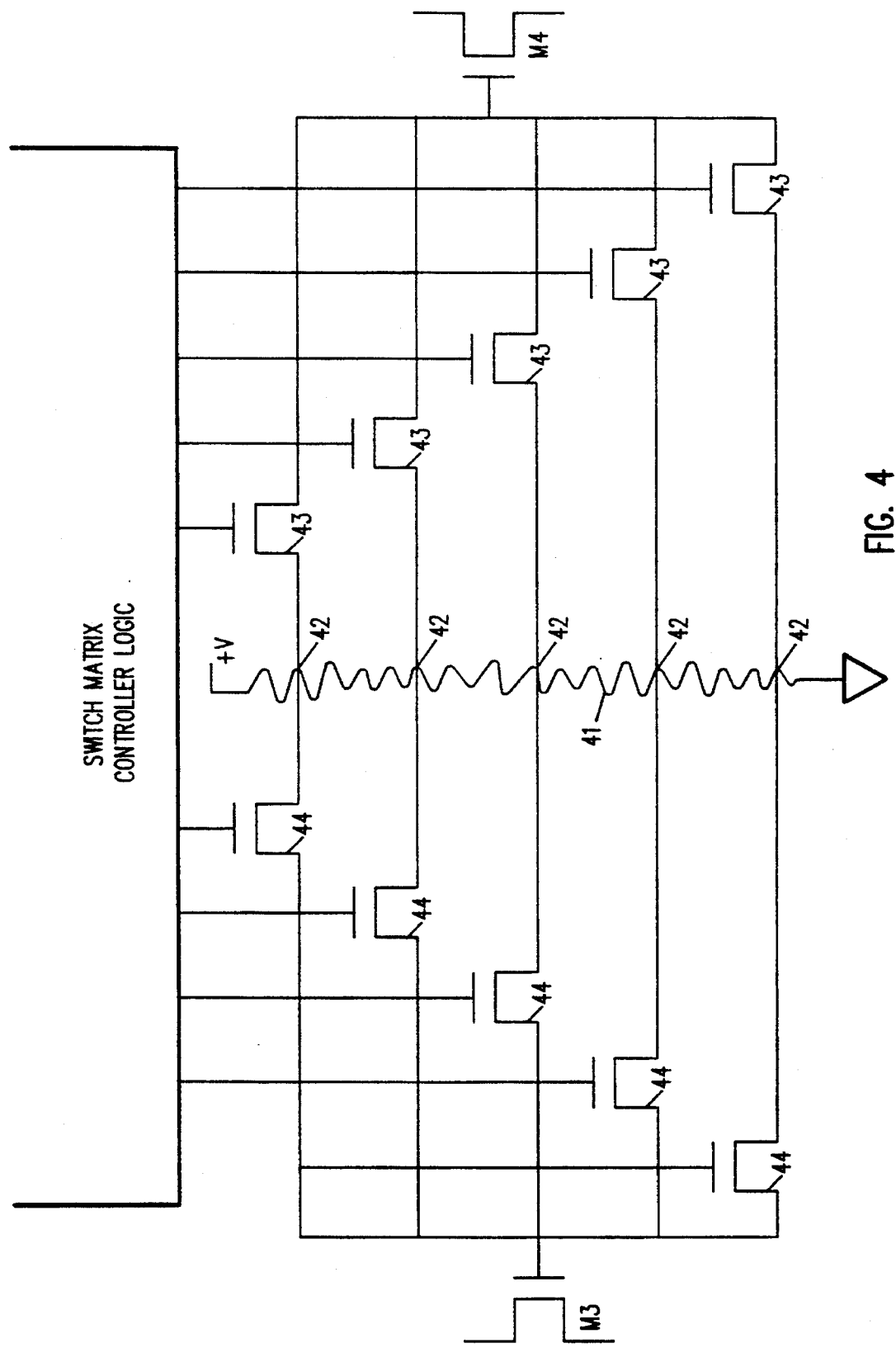
FIG. 4 illustrates a switch matrix which is used to make the hysteresis level programmable according to a second alternative embodiment of the present invention.

According to a second alternative embodiment, FIG. 4 illustrates a more complicated switch matrix which can be used to provide a variety of different hysteresis voltage levels. On an integrated circuit, the resistor 41 could be implemented as a polysilicon resistor with several taps. Each tap 42 represents a fixed voltage some fraction of the supply voltage. Therefore, each tap 42 has a common resistive voltage divider relationship between the supply voltage and ground. A set of n-channel transistors 43 or pass gates form a multiplexor which connects the gate of transistor M4 to one voltage, and a separate set of n-channel transistors 44 or pass gates form another multiplexor which connects the gate of transistor M3 to another voltage. By including a more complicated switch matrix having several taps 42 as in FIG. 4, the level of hysteresis can be made programmable. For a switch matrix with N taps, where each tap can be connected to the gate of either transistors M3 or M4, there are N(N-1)/2 different non-zero complementary hysteresis voltages which can be selected.

Figure 5:
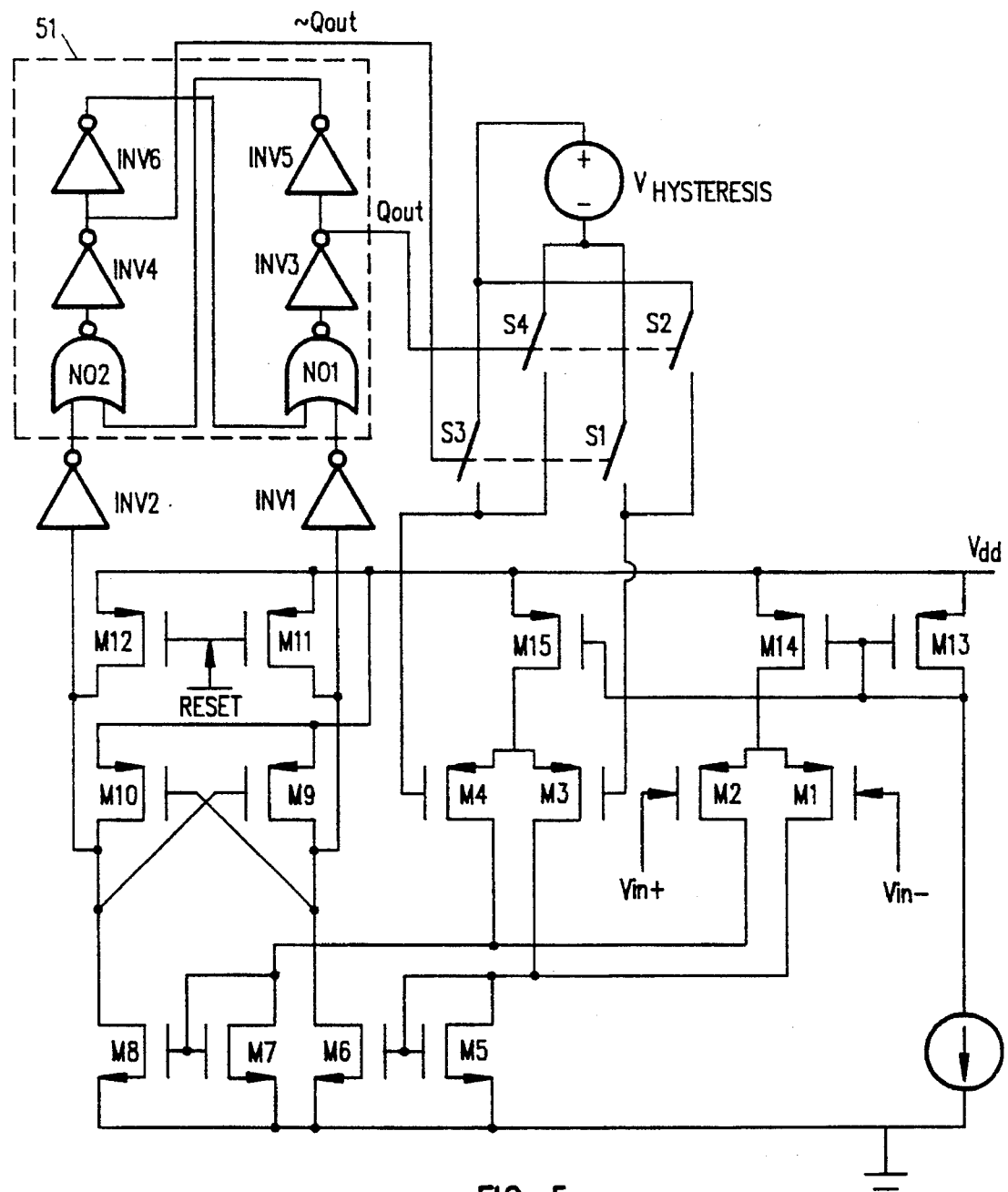
FIG. 5 shows a CMOS circuit which is a third alternative embodiment of the present invention.

In a third alternative embodiment, the comparator structure according to the present invention is easily translated so that the differential pairs are formed with p-channel transistors, and the current mirroring is done with n-channel transistors as shown in FIG. 5. The structure of the comparator in FIG. 5 is nearly identical to that of FIG. 2, except that the supply voltage $V_{dd}$ and ground are reversed in relation, all transistor types are inverted in type, so that N-type is converted into P-type, and P-type is converted into N-type. Secondly, the nand gates NA1 and NA2 are transformed into nor gates NO1 and NO2 in the latch 51 so that both outputs $Q_{out}$ and $\sim Q_{out}$ are never low simultaneously, thereby shorting out the hysteresis supply voltage. If the switch matrix including S1, S2, S3, and S4 is also translated so that p-channel pass transistors are used to implement switches S1, S2, S3, and S4, then non-overlapping clocks of this type (never low simultaneously) are desired to prevent S3 and S4 from simultaneously conducting, and to prevent S1 and S2 from simultaneously conducting.

Figure 6:
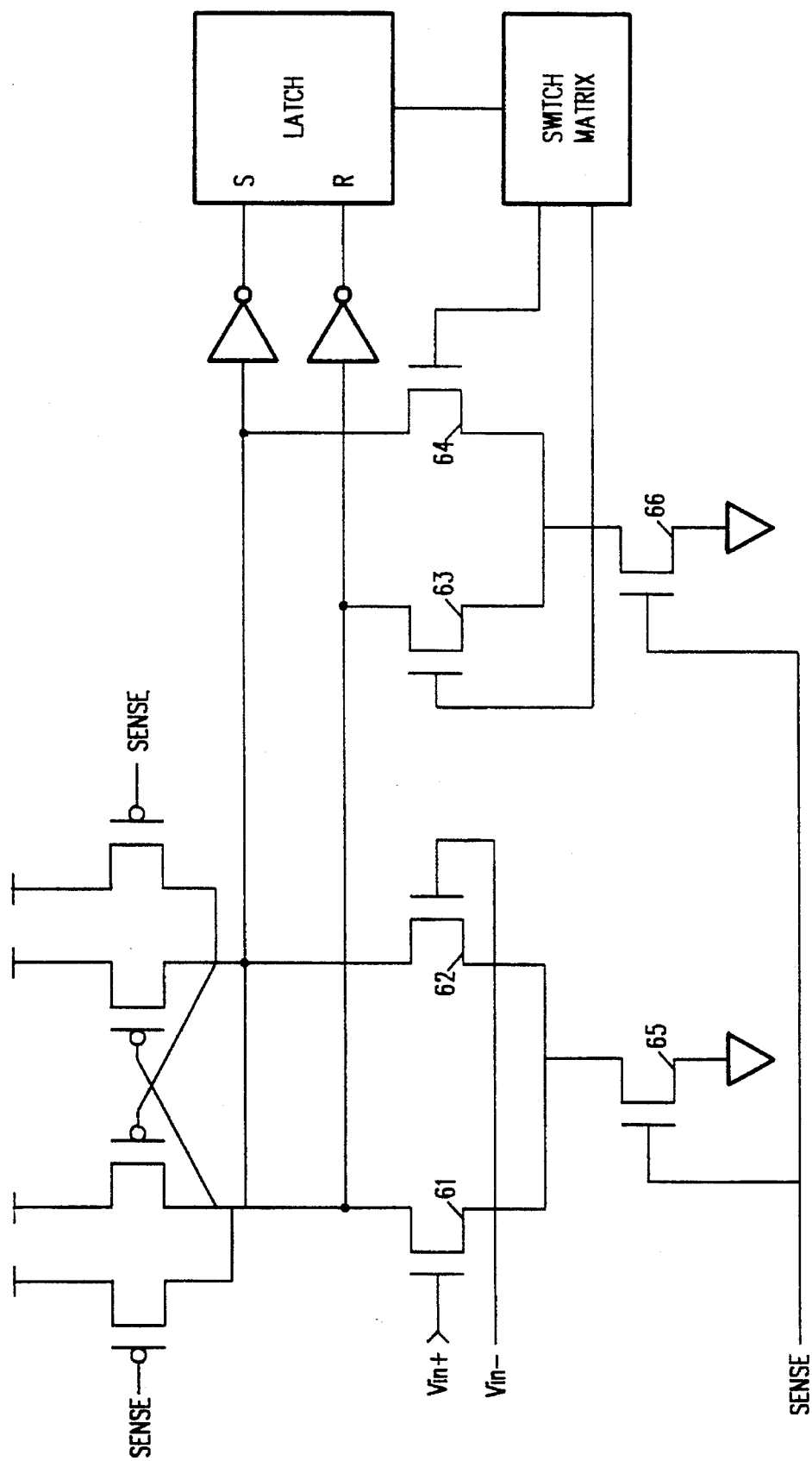
FIG. 6 shows a CMOS circuit which is a fourth alternative embodiment of the present invention.

According to a fourth alternative embodiment of the present invention, the programmable hysteresis can be applied to a sense amplifier as shown in FIG. 6. Although simpler in terms of the total transistor count, the sense amplifier structure produces large current spikes which cause noise in the system. This noise is a result of the fact that no current is conducting until both differential pairs 61, 62, 63, and 64 are turned on by transistors 65 and 66, at which time a relatively large current begins to flow.

The second alternative embodiment of the present invention is very useful in adaptive threshold systems. For example, if the receiving comparator is at the end of a 1.5 kilometer cable, the differential signal amplitude is on the order of 100 mV. In contrast, if the receiver is at the end of a 100 foot cable, the differential signal amplitude will be on the order of 2 volts. If the differential signal amplitude is on the order of 2 volts, the differential signal will have tails and noise components which are on the order of hundreds of millivolts. Thus, it is not desirable to have the hysteresis voltage set at 100 mV when the differential signal level is 2 volts, since very little noise immunity is gained by using hysteresis in this manner, because the noise margin $V_{hysteresis}$ of 100 mV is only 5% of the input voltage $V_{in+}-V_{in-}$ range. This noise margin is very narrow. It is desirable that the noise margin be approximately 50% input range. Using the programmability of the hysteresis level according to the present invention, it is possible to optimally set the hysteresis voltage level using adaptive feedback techniques such as described below.

Upon initially turning the comparator on, the hysteresis voltage is set to a level indicative of the best guess of the differential signal amplitude. A second comparator takes the differential signal as input, and has an offset voltage that is twice the hysteresis voltage of the first comparator. Periodically, over large blocks of data, a state machine will review the outputs of the two comparators. Optimally, for those clock cycles during which the first comparator detected a one, the second comparator will have detected that its offset voltage was exceeded during 50% of those clock cycles. If the second comparator's offset threshold was exceeded less than 50% of the time, the state machine adjusts the hysteresis level of the first comparator downward and adjusts the offset level of the second comparator downward twice as far. Similarly, if the second comparator's offset threshold was exceeded during more than 50% of the clock cycles during which the first comparator's offset threshold was exceeded, the state machine adjusts the hysteresis level of the first comparator upward and adjusts the offset level of the second comparator upward twice as far. Using this feedback strategy, the system will converge so that the hysteresis voltage is set at half the average peak differential signal amplitude. This is an effective way to control bias distortion, and thus to provide a lower bit error rate.

This invention virtually eliminates the effects of input stage transconductance on hysteresis. This eliminates the effects of processing and temperature on hysteresis and thresholds. The 10 Mz comparator (100 ns) can be realized dissipating only 1 mW of power.

The apparatuses of the present invention have been described in terms of its presently preferred embodiment and its four alternative embodiments. Those skilled in the art will recognize that the present invention may be practiced with modification and alteration within the spirit and scope of the appended claims. Therefore, the specifications and drawings are to be regarded in an illustrative rather than a restrictive sense.

What is claimed is:

1. A comparator, having first and second input voltage signals, for outputting a digital output value of a first or second output logic state, comprising:

an input stage, having a first current source, having as inputs the first and second input voltage signals, and having as outputs first and second input current signals, such that a summation of the first and second input current signals equals the first current source, and such that a magnitude of a difference in the first and second input current signals is monotonically related to a difference in the first and second input voltage signals;

a feedback stage, having a second current source, having as inputs first and second hysteresis voltages, and having as outputs first and second hysteresis current signals, such that a summation of the first and second hysteresis current signals equals the second current source, and such that a magnitude of a difference in the first and second hysteresis current signals is monotonically related to a difference in the first and second hysteresis voltage signals;

a current mirror stage, having as inputs the first and second input current signals and the first and second hysteresis current signals, and having as outputs first and second detection current signals, wherein the first detection current signal is proportional to a first sum of the first input current signal and the first hysteresis current signal, wherein the second detection current signal is proportional to a second sum of the second input current signal and the second hysteresis current signal; and a detection stage for detecting and outputting the digital output value, having as inputs the first and second detection current signals, such that the digital output value is the first output logic state when the first detection current signal is less than the second detection current signal, and is the second output logic state when the first detection current signal is greater than the second detection current signal.

2. A comparator as in claim 1, wherein the detection stage includes first and second detection transistors, wherein a gate of the first detection transistor is connected to a drain of the second detection transistor, wherein a gate of the second detection transistor is connected to a drain of the first detection transistor, wherein the drain of the first detection transistor is connected to the first detection current signal, wherein the drain of the second detection transistor is connected to the second detection current signal, such that, after precharging the drains of the first and second detection transistors to an equal voltage, a voltage differential develops across the drains of the first and second detection transistors corresponding to a difference between the first and second detection current signals.

3. A comparator as in claim 2, further comprising:

an output latch stage, capable of assuming a first or second state, wherein the output latch stage has first and second latch inputs connected to the drains of the first and second detection transistors, respectively, wherein the output latch assumes the first or second state in correspondence with the digital output value, such that the output latch assumes the first state when the first latch input is above a latch switching threshold, assumes the second state when the second latch input is above the latch switching threshold, and retains a previously held state when neither the first nor the second latch input is above the latch switching threshold, and wherein the output latch stage outputs the digital output value.

4. A comparator as in claim 3, further comprising:

a hysteresis voltage generator, having as input the digital output value from the output latch stage, and having as outputs the first and second hysteresis voltages, such that the first hysteresis voltage is a first reference voltage while the second hysteresis voltage is a second reference voltage when the digital output value is zero, and such that the first hysteresis voltage is the second reference voltage while the second hysteresis voltage is the first reference voltage when the digital output value is one.

5. A comparator as in claim 4, wherein the first and second current sources are first and second current source mirrors, respectively, of a predetermined reference current level.

6. A comparator as in claim 5, further comprising:

a first reset transistor, having its drain connected to the drain of the first detection transistor, having its source connected to a predetermined precharge voltage level, and having its gate connected to a reset signal, wherein the first reset transistor precharges the drain of the first detection transistor to the predetermined precharge voltage level when a reset signal is asserted; and a second reset transistor, having its drain connected to the drain of the second detection transistor, having it source connected to the predetermined precharge voltage level, and having its gate connected to a reset signal, wherein the second reset transistor precharges the drain of the second detection transistor to the predetermined precharge voltage level when the reset signal is asserted.

7. A comparator as in claim 6, wherein the predetermined precharge voltage level is a supply voltage.

8. A comparator as in claim 7, wherein the input stage includes first and second n-channel transistors, wherein the feedback stage includes third and fourth n-channel transistors, wherein the current mirror stage includes a fifth p-channel transistor as a first master and a sixth p-channel transistor as a first slave, wherein the current mirror stage includes a seventh p-channel transistor as a second master and an eighth p-channel transistor as a second slave, wherein the first detection transistor is a ninth n-channel transistor, wherein the second detection transistor is a tenth n-channel transistor, wherein the first reset transistor is an eleventh n-channel transistor, wherein the second reset transistor is a twelfth n-channel transistor, wherein the first current source mirror includes a thirteenth n-channel transistor as a third master and a fourteenth n-channel transistor as a third slave, and wherein the second current source mirror includes the thirteenth n-channel transistor as the third master and a fifteenth n-channel transistor as a fourth slave.

9. A comparator as in claim 8, wherein the predetermined precharge voltage level is ground.

10. A comparator as in claim 9, wherein the output latch stage comprises:

a first ratioed inverter having an input connected to the drain of the ninth n-channel transistor, wherein a ratio of pullup to pulldown transistor width is sufficient to lower a first switching threshold of the first ratioed inverter to the latch switching threshold;

a second ratioed inverter having an input connected to the drain of the tenth n-channel transistor, wherein a ratio of pullup to pulldown transistor width is sufficient to lower a second switching threshold of the second ratioed inverter to the latch switching threshold;

a first two-input NAND gate having an output of the first ratioed inverter as a first input;

a third inverter having an output of the first two-input NAND gate as input, and having the digital output value as output;

a second two-input NAND gate having an output of the second ratioed inverter as a first input;

a fourth inverter having an output of the second two-input NAND gate as input, and having a logical complement of the digital output value as output;

a fifth inverter having the output of the third inverter as input, and having an output connected to a second input of the second two-input NAND gate; and a sixth inverter having the output of the fourth inverter as input, and having an output connected to a second input of the first two-input NAND gate.

11. A comparator as in claim 10, wherein the hysteresis voltage generator comprises:

a voltage source having positive and negative terminals; and a switch matrix for connecting the positive terminal to a gate of the third n-channel transistor and for connecting the negative terminal to a gate of the fourth n-channel transistor when the digital output value is a predetermined logic value, and for connecting the positive terminal to the gate of the fourth n-channel transistor and for connecting the negative terminal to the gate of the third n-channel transistor when the digital output value is the logical inverse of the predetermined logic value.

12. A comparator as in claim 11, wherein the switch matrix comprises:

a first n-channel switch transistor having a drain connected to the positive terminal, a source connected to the gate of the third n-channel transistor, and a gate connected to the output of the fourth inverter;

a second n-channel switch transistor having a drain connected to the negative terminal, a source connected to the gate of the third n-channel transistor, and a gate connected to the output of the third inverter;

a third n-channel switch transistor having a drain connected to the negative terminal, a source connected to the gate of the fourth n-channel transistor, and a gate connected to the output of the fourth inverter; and a fourth n-channel switch transistor having a drain connected to the positive terminal, a source connected to the gate of the fourth n-channel transistor, and a gate connected to the output of the third inverter.

13. A comparator as in claim 10, wherein the hysteresis voltage generator comprises:

a plurality of voltage levels;

a plurality of n-channel switch transistors, such that a subset of the plurality of switch transistors connects each voltage level of the plurality of voltage levels to the gate of the third n-channel transistor, and a different subset of the plurality of switch transistors connects each voltage level of the plurality of voltage levels to the gate of the fourth n-channel transistor; and a switch controller which takes the digital output value as input, which controls the switch matrix so as to provide a level of hysteresis determined by the digital output value and other programmable variables.

14. A comparator as in claim 7, wherein the input stage includes first and second p-channel transistors, wherein the feedback stage includes third and fourth p-channel transistors, wherein the current mirror stage includes a fifth n-channel transistor as a first master and a sixth n-channel transistor as a first slave, wherein the current mirror stage includes a seventh n-channel transistor as a second master and an eighth n-channel transistor as a second slave, wherein the first detection transistor is a ninth p-channel transistor, wherein the second detection transistor is a tenth p-channel transistor, wherein the first reset transistor is an eleventh p-channel transistor, wherein the second reset transistor is a twelfth p-channel transistor, wherein the first current source mirror includes a thirteenth p-channel transistor as a third master and a fourteenth p-channel transistor as a third slave, and wherein the second current source mirror includes the thirteenth p-channel transistor as the third master and a fifteenth p-channel transistor as a fourth slave.

15. A comparator as in claim 14, wherein the predetermined precharge voltage level is a positive supply voltage.

16. A comparator as in claim 15, wherein the output latch stage comprises:

a first ratioed inverter having an input connected to the drain of the ninth p-channel transistor, wherein a ratio of pullup to pulldown transistor width is sufficient to raise a first switching threshold of the first ratioed inverter to the latch switching threshold;

a second ratioed inverter having an input connected to the drain of the tenth p-channel transistor, wherein a ratio of pullup to pulldown transistor width is sufficient to raise a second switching threshold of the second ratioed inverter to the latch switching threshold;

a first two-input NOR gate having an output of the first ratioed inverter as a first input;

a third inverter having an output of the first two-input NOR gate as input, and having the digital output value as output;

a second two-input NOR gate having an output of the second ratioed inverter as a first input;

a fourth inverter having an output of the second two-input NOR gate as input, and having a logical complement of the digital output value as output;

a fifth inverter having the output of the third inverter as input, and having an output connected to a second input of the second two-input NOR gate; and a sixth inverter having the output of the fourth inverter as input, and having an output connected to a second input of the first two-input NOR gate.

17. A comparator as in claim 16, wherein the hysteresis voltage generator comprises:

a voltage source having positive and negative terminals; and a switch matrix for connecting the positive terminal to a gate of the third p-channel transistor and for connecting the negative terminal to a gate of the fourth p-channel transistor when the digital output value is a predetermined logic value, and for connecting the positive terminal to the gate of the fourth p-channel transistor and for connecting the negative terminal to the gate of the third p-channel transistor when the digital output value is the logical inverse of the predetermined logic value.

18. A comparator as in claim 17, wherein the switch matrix comprises:

a first p-channel switch transistor having a drain connected to the positive terminal, a source connected to the gate of the third p-channel transistor, and a gate connected to the output of the fourth inverter;

a second p-channel switch transistor having a drain connected to the negative terminal, a source connected to the gate of the third p-channel transistor, and a gate connected to the output of the third inverter;

a third p-channel switch transistor having a drain connected to the negative terminal, a source connected to the gate of the fourth p-channel transistor, and a gate connected to the output of the fourth inverter; and a fourth p-channel switch transistor having a drain connected to the positive terminal, a source connected to the gate of the fourth p-channel transistor, and a gate connected to the output of the third inverter.

19. A comparator as in claim 16, wherein the hysteresis voltage generator comprises:

a plurality of voltage levels;

a plurality of p-channel switch transistors, such that a subset of the plurality of switch transistors connects each voltage level of the plurality of voltage levels to the gate of the third p-channel transistor, and a different subset of the plurality of switch transistors connects each voltage level of the plurality of voltage levels to the gate of the fourth p-channel transistor; and a switch controller which takes the digital output value as input, which controls the switch matrix so as to provide a level of hysteresis determined by the digital output value and other programmable variables.

* * * * *